United States Patent
Komine

(10) Patent No.: US 7,092,068 B2
(45) Date of Patent: Aug. 15, 2006

(54) RETICLE, EXPOSURE MONITORING METHOD, EXPOSURE METHOD AND MANUFACTURING METHOD FOR SEMICONDUCTOR DEVICE

(75) Inventor: Nobuhiro Komine, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 10/721,903

(22) Filed: Nov. 26, 2003

(65) Prior Publication Data

US 2005/0105068 A1 May 19, 2005

(30) Foreign Application Priority Data

Nov. 26, 2002 (JP) .................... P 2002-342798

(51) Int. Cl.
*G03B 27/42* (2006.01)

(52) U.S. Cl. ................... 355/53; 355/55; 355/67; 355/77; 430/5; 430/30; 430/311; 250/548; 250/492.1; 356/400; 356/401

(58) Field of Classification Search ........... 355/53, 355/55, 67, 77; 430/5, 30, 311; 356/400, 356/401; 250/548, 492.1, 492.2
See application file for complete search history.

(56) References Cited

U.S. PATENT DOCUMENTS

| | | | | |
|---|---|---|---|---|
| 5,814,425 A | * | 9/1998 | Kataoka et al. ............... | 355/77 |
| 5,976,740 A | * | 11/1999 | Ausschnitt et al. ........... | 430/30 |
| 5,976,741 A | * | 11/1999 | Ziger et al. .................... | 430/30 |
| 6,057,908 A | * | 5/2000 | Ota .............................. | 355/53 |
| 6,226,074 B1 | | 5/2001 | Fujisawa et al. .............. | 353/53 |
| 6,251,544 B1 | * | 6/2001 | Inoue et al. ................... | 430/5 |
| 6,317,211 B1 | * | 11/2001 | Ausschnitt et al. ........... | 356/401 |
| 6,376,139 B1 | * | 4/2002 | Fujisawa et al. .............. | 430/30 |
| 6,607,863 B1 | * | 8/2003 | Irie .............................. | 430/30 |
| 2004/0058256 A1 | * | 3/2004 | Fujisawa et al. .............. | 430/30 |

FOREIGN PATENT DOCUMENTS

| | | |
|---|---|---|
| JP | 2000-310850 | 11/2000 |
| JP | 2001-319871 | 11/2001 |
| JP | 2002-025895 | 1/2002 |

OTHER PUBLICATIONS

Notice of Grounds for Rejection, issued by the Japanese Patent Office, mailed Jun. 21, 2005, in Japanese Patent Application Serial No. P2002-342798, and English-language translation thereof.
Dirksen et al., "Focus and exposure dose determination using stepper alignment," SPIE (1996), 2726:799-808.
Starikov, "Exposure Monitor Structure," SPIE (1990), 1261:315-324.

* cited by examiner

*Primary Examiner*—D. Rutledge
(74) *Attorney, Agent, or Firm*—Finnegan, Henderson, Farabow, Garrett & Dunner, L.L.P.

(57) ABSTRACT

A reticle includes a first mask portion including a first opaque portion, first and second exposure monitor patterns provided within first and second window portions in the first opaque portion, increasing transmittances in a first direction and a direction reverse to the first direction, respectively; and a second mask potion including a second opaque portion, third and fourth exposure monitor patterns provided within third and fourth window portions in the second opaque portion in positions corresponding to the first opaque portion upon alignment with the first mask portion, increasing transmittances in the first direction and the reverse direction, respectively.

25 Claims, 12 Drawing Sheets

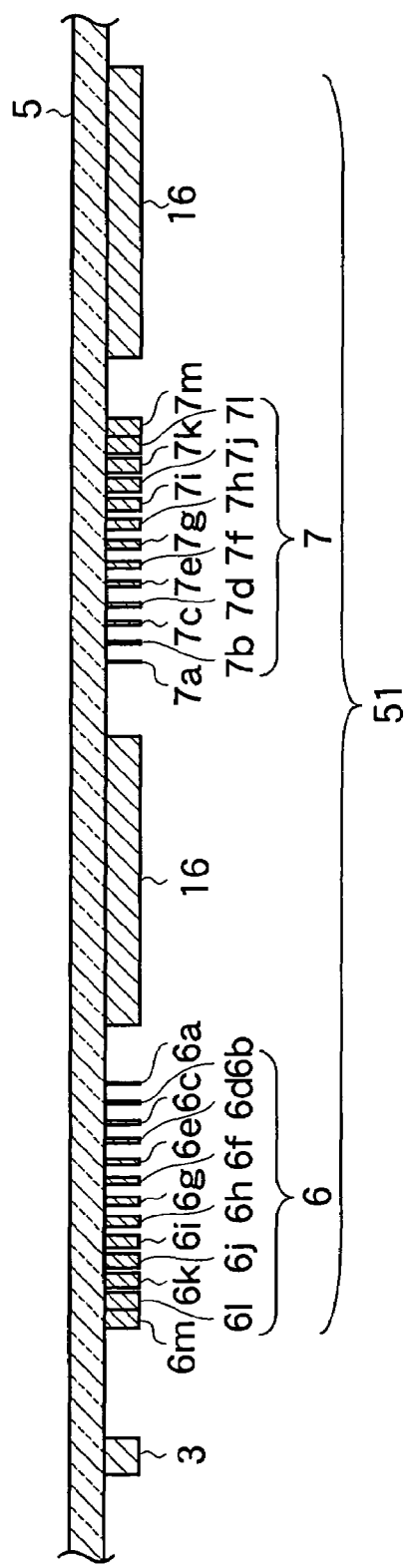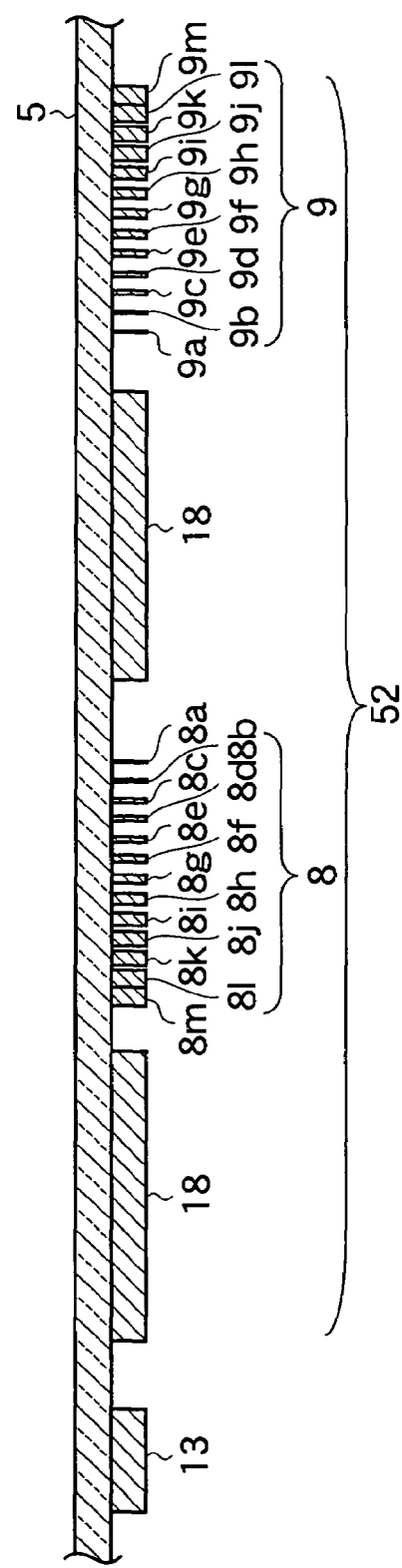

RETICLE, EXPOSURE MONITORING METHOD, EXPOSURE METHOD AND MANUFACTURING METHOD FOR SEMICONDUCTOR DEVICE

CROSS REFERENCE TO RELATED APPLICATIONS

This application is based upon and claims the benefit of priority from prior Japanese Patent Application P2002-342798 filed on Nov. 26, 2002; the entire contents of which are incorporated by reference herein.

BACKGROUND OF THE INVENTION

1. Field of the Invention

The present invention relates to a reticle and an exposure monitoring method, which are configured to monitor an effective exposure dose in a multiple exposure process. Moreover, the present invention relates to an exposure method and a manufacturing method for a semiconductor device, which apply the exposure monitoring method.

2. Description of the Related Art

A multiple exposure which required a plurality of exposure processes is attracting attention in recent years as a microfabrication technique for a semiconductor device. The performance of a semiconductor device is largely controlled by dimensions of wiring patterns. For this reason, a control parameter for enhancing dimensional accuracy in a process using the multiple exposure needs to be highly accurately controlled. When using the multiple exposure, an exposure condition is normally determined for each exposure step so that the multiple exposure is implemented by executing the respective exposure steps under the determined exposure conditions.

A photolithography is a process to transfer a circuit pattern on a semiconductor substrate coated with a resist film by use of an aligner. In pattern formation using a reduction projection aligner, resolution of the aligner is in proportion to a wavelength λ of exposure light and is in inverse proportion to a numerical aperture NA. Therefore, because of the demand for miniaturization of semiconductor devices, process improvement associated therewith has been heretofore conducted, including shortening of the exposure light wavelength and achieving a higher NA of a projection lens. However, along with the recent demands for further miniaturization of the semiconductor device, it has become extremely difficult to ensure appropriate exposure latitude and depth of focus. Thus, in order to make measurable improvements in the dimensional precision in processing by effectively utilizing a small exposure margin without causing a reduction in yield, i.e., the amount of production, an exposure dose and focus control with a higher degree of accuracy is required.

Proposals have been made for an exposure monitoring method with attention on exposure control, in "A. Starikov, "Exposure monitor structure", SPIE Integrated Circuit Metrology, Inspection, and Process Control IV, vol. 1261, 1990, p. 315 and in Japanese Patent Laid-Open No. 2000-310850. The proposals have a common characteristic in that, in a stepper, an image is transferred with an inclined exposure distribution by using a reticle having a pattern therein with a dimensional ratio (a duty ratio) of a transparent portion and an opaque portion continuously changed in one direction by a pitch that cannot resolve images on the semiconductor substrate. By use of this method, a variation distribution of an effective optimum exposure dose in resist mask pattern formation can be provided. Meanwhile, there is also a known method of forming patterns provided with an inclined distribution of irradiation by means of continuously disposing a plurality of patterns having different transmittances (see "SPIE Optical Microlithography IX", Vol. 2726, 1996, p. 799).

As described above, it is important in microfabrication to control exposure conditions for photolithography with high accuracy to obtain processing accuracy and uniformity in pattern dimensions of a semiconductor device. However, in the case of double exposure, there is a so-called "fogging" influence caused by a first exposure step and a second exposure step. As used herein, the term "fogging" refers to an affect in which an image is exposed by an undesirable light. The exposure dose is deviated from the exposure condition which is originally set up because of the fogging of the two exposure steps. As a result, the finished pattern dimensions are different from the original design. Moreover, although the current exposure dose monitoring method can estimate the effective exposure doses in the respective exposure steps in the multiple exposure, the exposure dose monitoring method cannot estimate the influences on the respective exposure doses which are caused by the multiple exposure process.

SUMMARY OF THE INVENTION

A first aspect of the present invention inheres in a reticle including a first mask portion including a first opaque portion, a first exposure monitor pattern provided with in a first window portion in the first opaque portion and configured to increase optical transmittances in a first direction, and a second exposure monitor pattern provided within a second window portion in the first opaque portion and configured to increase optical transmittances in a direction reverse to the first direction; and a second mask potion including a second opaque portion, a third exposure monitor pattern provided within a third window portion in the second opaque portion in a position corresponding to the first opaque portion upon alignment with a transferred image of the first mask portion and configured to increase optical transmittances in the first direction, and a fourth exposure monitor pattern provided within a fourth window portion in the second opaque portion in a position corresponding to the first opaque portion and configured to increase optical transmittances in the reverse direction.

A second aspect of the present invention inheres in an exposure monitoring method including transferring a first exposure monitor pattern onto a resist film through a first window portion provided on a first opaque portion by a first exposure dose while allowing the exposure dose to form an inclined distribution in a first direction; transferring a second exposure monitor pattern onto an unexposed portion of the resist film through a second window portion provided on the first opaque portion by the first exposure dose while allowing the exposure dose to form an inclined distribution in a direction reverse to the first direction; transferring a third exposure monitor pattern onto an unexposed portion of the resist film through a third window portion provided on a second opaque portion located in a position corresponding to the first opaque portion by a variable exposure dose while allowing the exposure dose to form an inclined distribution in the first direction; transferring a fourth exposure monitor pattern onto an unexposed portion of the resist film through a fourth window portion provided on the second opaque portion located in a position corresponding to the first opaque portion by the variable exposure dose while allowing the exposure dose to form an inclined distribution in the reverse direction; measuring a first pattern displacement between first and third monitor resist patterns where the first and third exposure monitor patterns are transferred, and a second pattern displacement between second and fourth monitor resist patterns where the second and fourth exposure monitor patterns are transferred; obtaining a displacement between the first pattern displacement and the second pattern displacement relative to an exposure difference between the first exposure dose and the variable exposure dose; and calculating a fogging exposure dose attributable to the first exposure dose from a displacement value provided when the variable exposure dose is equal to the first exposure dose.

A third aspect of the present invention inheres in an exposure method including respectively measuring first and second fogging exposure doses relative to a first exposure dose for exposing a first mask portion so as to transfer a first image on an inspection resist film and a second exposure dose for exposing a second mask portion while overlaying a second image transferred through the second mask portion over the first image; preparing a reticle including the first mask portion, and a substrate coated with a working resist film; transferring the first image of the first mask portion onto the working resist film by an exposure dose obtained by subtracting the second fogging exposure dose from the first exposure dose; preparing a reticle including the second mask portion; and transferring the second image of the second mask portion onto the working resist film by an exposure dose obtained by subtracting the first fogging exposure dose from the second exposure dose.

A fourth aspect of the present invention inheres in a manufacturing method for a semiconductor device including respectively measuring first and second fogging exposure doses relative to a first exposure dose for exposing a first mask portion so as to transfer a first image on an inspection resist film and a second exposure dose for exposing a second mask portion while overlaying a second image transferred through the second mask portion over the first image; coating a working resist film on a semiconductor substrate; placing the semiconductor substrate and a reticle including the first mask portion on an aligner; transferring the first image of the first mask portion onto the working resist film by an exposure dose obtained by subtracting the second fogging exposure dose from the first exposure dose; placing a reticle including the second mask portion on the aligner; and transferring the second image of the second mask portion onto the working resist film by an exposure dose obtained by subtracting the first fogging exposure dose from the second exposure dose.

BRIEF DESCRIPTION OF DRAWINGS

FIG. 3 is an enlarged cross-sectional view of the reticle according to the embodiment of the present invention which is taken along the III—III line in FIG. 2.

FIG. 4 is an enlarged cross-sectional view of the reticle according to the embodiment of the present invention which is taken along the IV—IV line in FIG. 2.

DETAILED DESCRIPTION OF THE INVENTION

Figure 1:
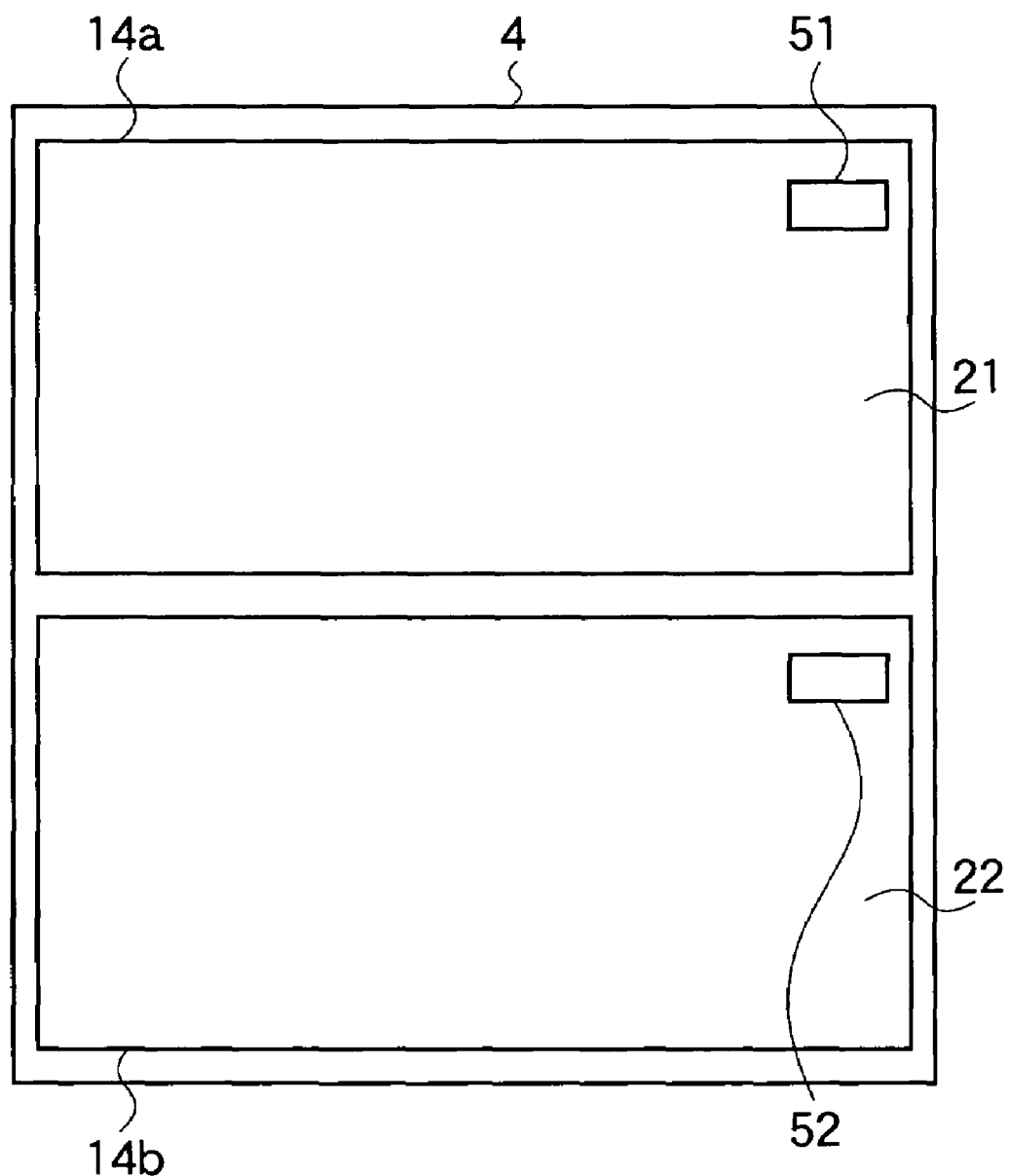
FIG. 1 is a layout view showing one example of a reticle according to an embodiment of the present invention.

An embodiment of the present invention will be described with reference to the accompanying drawings. It is to be noted that the same or similar reference numerals are applied to the same or similar parts and elements throughout the drawings, and the description of the same or similar parts and elements will be omitted or simplified.

As shown in FIG. 1, a reticle 4 for double exposure according to an embodiment of the present invention includes a first mask portion 14a having a first circuit pattern region 21 in which a circuit pattern to be exposed in a first exposure step is disposed, and a second mask portion 14b having a second circuit pattern region 22 in which a circuit pattern to be exposed in a second exposure step so as to overlay a first circuit pattern exposed from the first mask portion is disposed. A first displacement monitor 51 configured to measure an exposure dose in the first exposure step is provided in the first mask portion 14a. A second displacement monitor 52 configured to measure an exposure dose in the second exposure step is provided in the second mask portion 14b. Here, the second displacement monitor 52 is located in a position to be exposed in the second exposure step so as to overlay the first displacement monitor 51 which is exposed in the first exposure step. The first and second displacement monitors 51 and 52 are located in positions within the first and second circuit pattern regions 21 and 22 where the circuit patterns are not provided.

Figure 2:
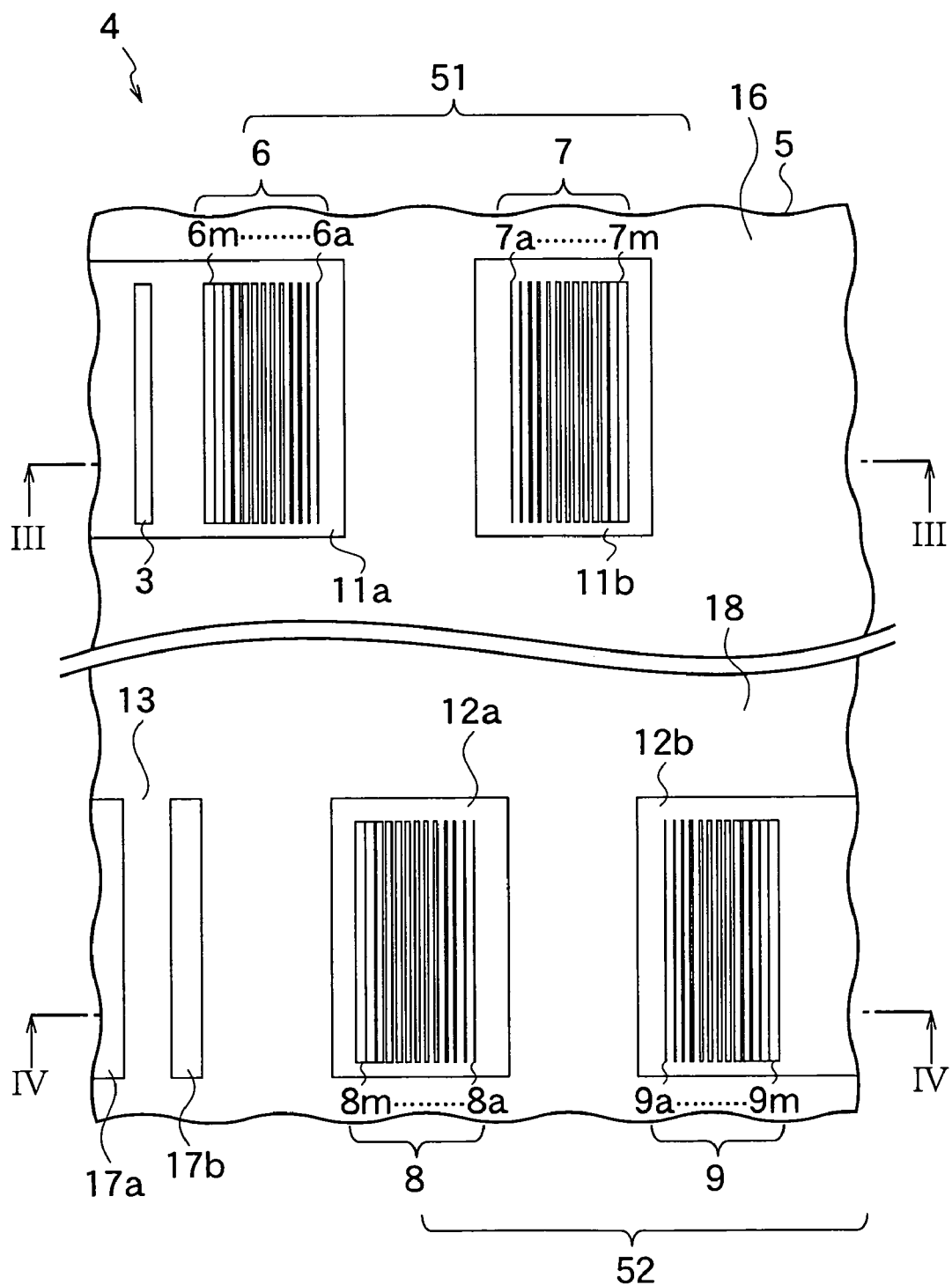
FIG. 2 is an enlarged plan view showing the example of the reticle according to the embodiment of the present invention.

In the first displacement monitor 51 of the first mask portion 14a, as shown in an enlarged plan view in FIG. 2 and an enlarged cross-sectional view in FIG. 3, a first window portion 11a and a second window portion 11b are provided on a first opaque portion 16 on a transparent substrate 5. First and second exposure monitor patterns 6 and 7 are provided in the first and second window portions 11a and 11b, respectively. The first exposure monitor pattern 6 is formed into a diffraction grating including a plurality of opaque films 6a to 6m which are configured to increase pattern widths continuously in one direction from the left side to the right side of the drawing page. The second exposure monitor pattern 7 is formed into a diffraction grating including a plurality of opaque films 7a to 7m which are configured to increase pattern widths continuously in a direction which is reverse to the foregoing first exposure monitor pattern 6. Moreover, in the first window portion 11a, a wiring pattern 3 and the like which constitutes part of the circuit pattern in the first circuit pattern region 21 is provided adjacent to the first exposure monitor pattern 6 on the left side of the first exposure monitor pattern 6 as observed from the drawing figure.

In the second displacement monitor 52 of the second mask portion 14b, as shown in the enlarged plan view in FIG. 2 and an enlarged cross-sectional view in FIG. 4, a third window portion 12a and a fourth window portion 12b are provided on a second opaque portion 18 on the transparent substrate 5. Third and fourth exposure monitor patterns 8 and 9 are provided in the third and fourth window portions 12a and 12b, respectively. The third exposure monitor pattern 8 is formed into a diffraction grating including a plurality of opaque films 8a to 8m which are configured to increase pattern widths continuously in one direction from the left side to the right side of the page, as shown in the drawing. The fourth exposure monitor pattern 9 is formed into a diffraction grating including a plurality of opaque films 9a to 9m which are configured to increase pattern widths continuously in a direction reverse to the foregoing third exposure monitor pattern 8. Moreover, on the left side of the third window portion 12a as observed from the front of the figure, a wiring opaque portion 13 in the second circuit pattern region 22 is provided so as to be sandwiched between wiring window portions 17a and 17b. Here, the first and third exposure monitor patterns 6 and 8, and the second and fourth exposure monitor patterns 7 and 9 have the same pattern dimensions although the latter patterns 7 and 9 are reversed by 180 degrees.

Figure 5:
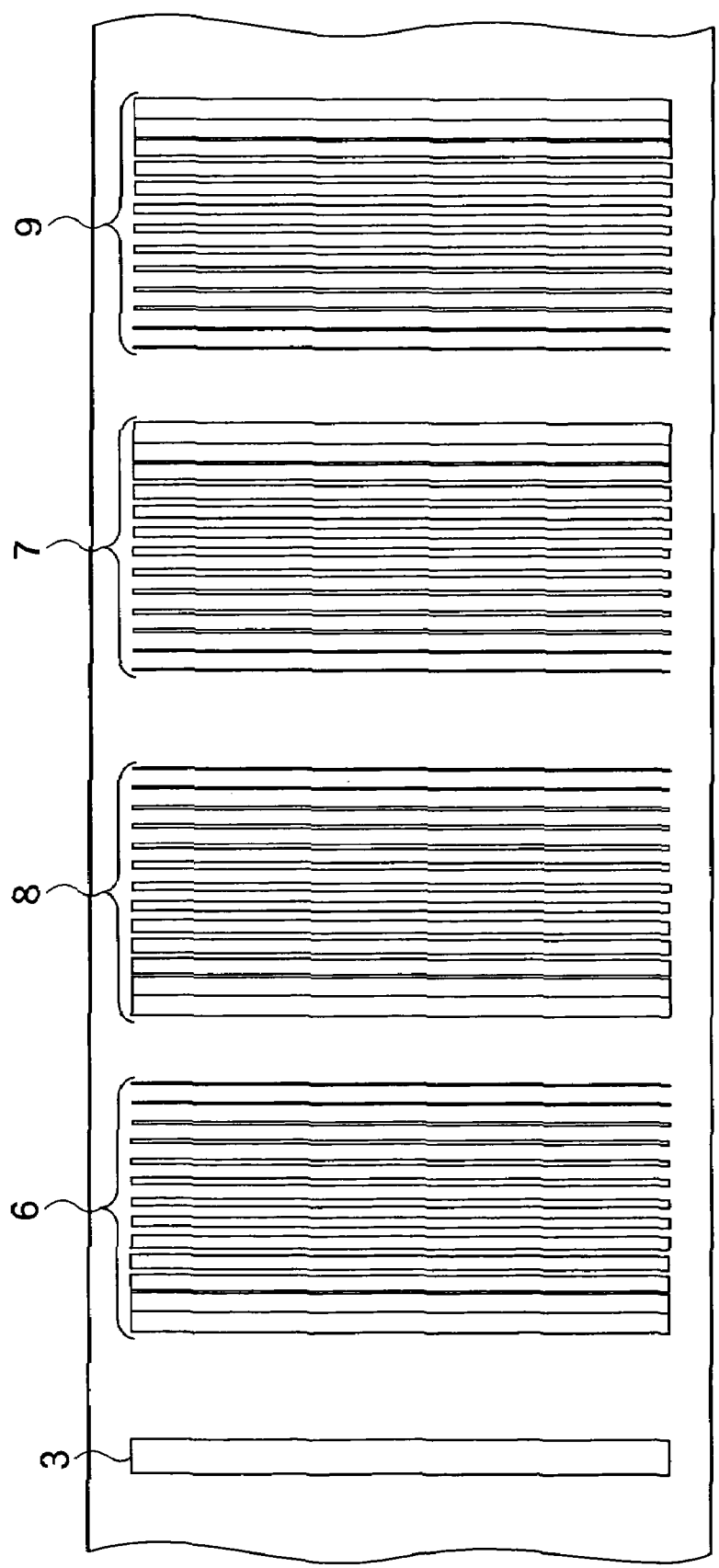
FIG. 5 is a view showing one example of fogging first and second displacement monitors in a double exposure method according to the embodiment of the present invention.

Mask alignment of the first and second displacement monitors 51 and 52 in the first and second exposure steps will be described with reference to FIG. 5. As shown in FIG. 5, the first exposure monitor pattern 6 provided in the first window portion 11a is located in a position corresponding to the second opaque portion 18 of the second mask portion 14b, for example, in a space between the third window portion 12a and the wiring window portion 17b. The second exposure monitor pattern 7 provided in the second window portion 11b is also located in a position corresponding to the second opaque portion 18 of the second mask portion 14b, for example, in a space between the third and fourth window portions 12a and 12b. The third exposure monitor pattern 8 provided in the third window portion 12a is located in a position corresponding to the first opaque portion 16 of the first mask portion 14a, for example, in a space between the first and second window portions 11a and 11b. The fourth exposure monitor pattern 9 provided in the fourth window portion 12b is located in a position corresponding to the first opaque portion 16 of the first mask portion 14a, for example, on the left side of the second window portion 11b as observed from the drawing. The wiring pattern 3 of the first mask portion 14a is located in a position to be shielded by the wiring opaque portion 13 of the second mask portion 14b.

In a double exposure process, the circuit pattern including the wiring pattern 3 and the like of the first mask portion 14a, and the first and second exposure monitor patterns 6 and 7 of the first displacement monitor 51 are subjected to exposure in the first exposure step. Subsequently, in the second exposure step, the third and fourth exposure monitor patterns 8 and 9 are subjected to exposure in the region of the first opaque portion 16 which is shielded in the first exposure step. In this event, the exposed first and second exposure monitor patterns 6 and 7 are shielded by the second opaque portion 18 in the second exposure step. The wiring pattern 3 of the first mask portion 14a exposed in the first exposure step is shielded by the wiring opaque portion 13 of the second mask portion 14b in the second exposure step.

Figure 6:
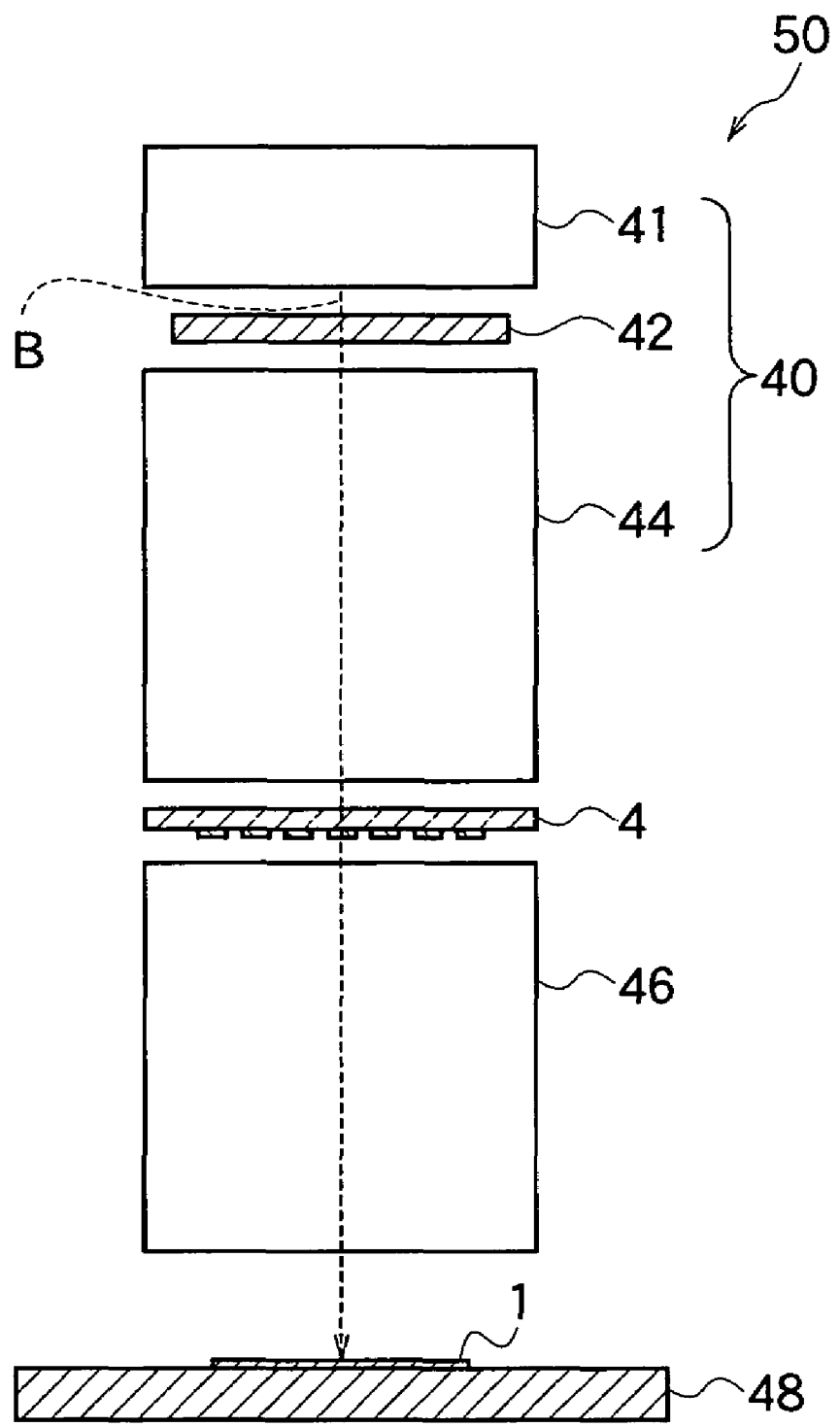
FIG. 6 is a schematic block diagram of an aligner used in a monitoring method according to the embodiment of the present invention.

An aligner 50 used for description of the double exposure process according to the embodiment of the present invention is a reduction projection aligner (a stepper), as shown in FIG. 6, having a reduction ratio of 1:4, for example. An illumination optical system 40 includes a light source 41, a shutter 42, and an illumination lens system 44. A krypton fluoride (KrF) excimer laser having a wavelength $\lambda$ of 248 nm is used as the light source 41, and the illumination lens system 44 includes a fly-eye lens and a condenser lens. A coherence factor $\sigma$ of the illumination optical system is set to 0.75. A projection optical system 46 includes a projection lens, an aperture stop and the like, and a lens numerical aperture NA is 0.6. An exposure light B projects a reduced pattern on the reticle 4 provided between the illumination optical system 45 and the projection optical system 46 onto a semiconductor substrate 1 provided on a stage 48. In the double exposure process, the first mask portion 14a on the reticle 4 is first exposed onto a shot area (an area exposed by a single event of light illumination) of the semiconductor substrate 1 by a step-and-repeat process. Subsequently, the second mask portion 14b on the reticle 4 is exposed onto the shot area after exposure of the first mask portion 14a by the step-and-repeat process. An exposure area range per shot is set to 20 mm by 20 mm. Although the reduction ratio of the aligner 50 is herein set to 1:4 for convenience of explanation, it is needless to say that any reduction ratio is applicable. In the following description, the dimension of a pattern on the reticle 4 will be described in terms of a dimension demagnified and projected on the semiconductor substrate 1 unless otherwise noted.

Figure 7A:
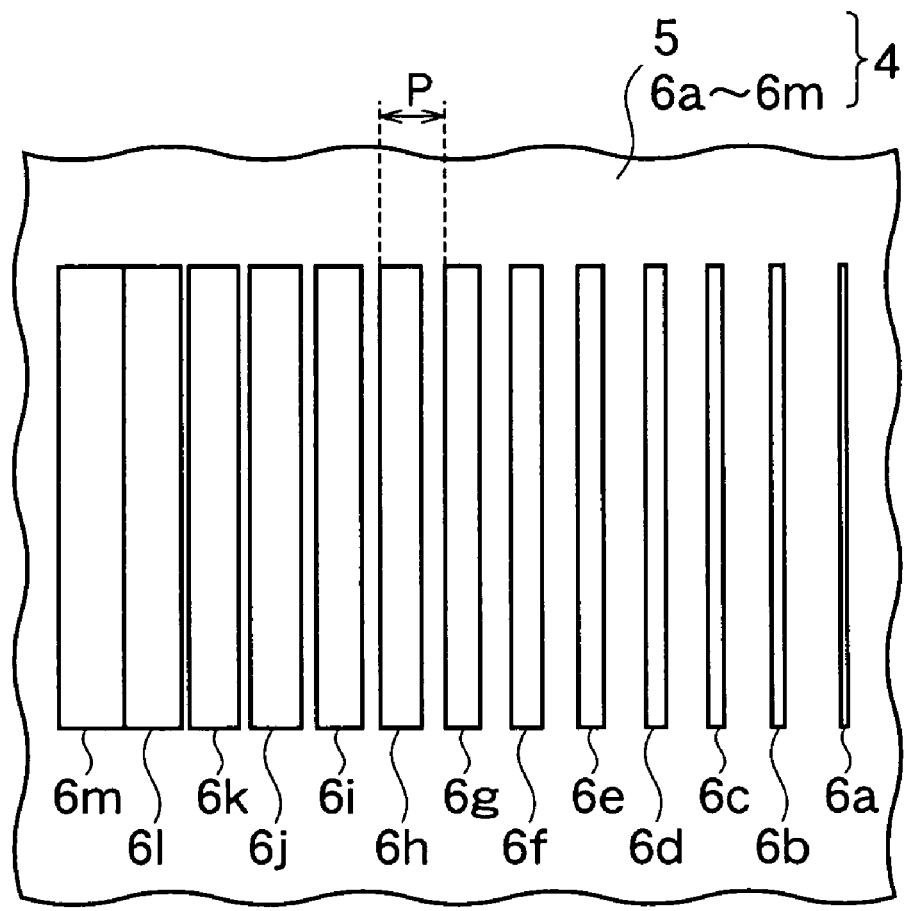
FIGS. 7A and 7B are a greatly enlarged plan view and a greatly enlarged cross-sectional view showing the detailed example of the reticle according to the embodiment of the present invention.
Figure 7B:
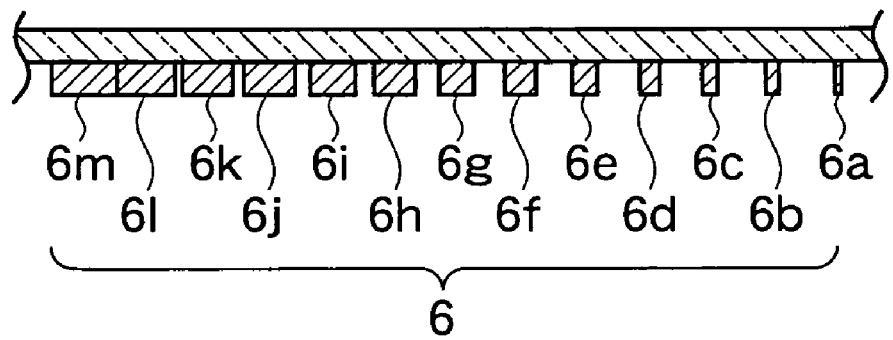

Next, an exposure monitoring method according to the embodiment of the present invention will be described while taking the first exposure monitor pattern 6 as an example for simplicity. As shown in FIGS. 7A and 7B, the first exposure monitor pattern 6 is the diffraction grating configured to continuously change opening ratios by increasing the widths of the plurality of opaque films 6a to 6m provided on the transparent substrate 5 at a constant rate by a fixed pitch P. The right side of the opaque film 6a shows the maximum opening ratio which is close to 100% as observed from the drawing; meanwhile, the opaque film 6m has an opening ratio of 0%. When the pitch P satisfies the following condition;

$$P<\lambda/NA*(1+\sigma) \qquad (1)$$

at the wavelength $\lambda$ and the numerical aperture NA, a diffraction grating pattern of the first exposure monitor pattern 6 is not resolved on the substrate. Although the exposure light B is diffracted by the diffraction grating of the first exposure monitor pattern 6, first-order diffraction light is shielded by the aperture stop in the projection optical system 46 of the aligner 50 and therefore does not project onto a surface of the semiconductor substrate 1. In other words, only intensity distribution of a zero-order diffraction light is provided on the surface of the semiconductor substrate 1 in response to the opening ratios of the diffraction grating pattern and no diffraction grating pattern is resolved thereon. That is, optical transmittances caused by the diffraction grating pattern continuously vary in proportion to the opening ratios at a constant rate in one direction. Accordingly, amounts of transmitting exposure light constitute an inclined distribution. In the case of the aligner 50 ($\lambda$: 248 nm, NA: 0.6, $\sigma$: 0.75) used for describing the embodiment of the present invention, the pitch P satisfying the condition of Formula (1) will be about 234 nm or less. Here, the pitch P is set to 190 nm.

A positive-type resist used for describing the embodiment of the present invention is sensitive to a minimum exposure dose EXc and above, for example. A resist film exposed to an exposure dose equal to or higher than the minimum exposure dose EXc is dissolved in a development process and thereby reduced. For an exposure dose equal to or higher than a maximum exposure dose EX0, the resist film is completely dissolved. An exposure dose EX which is set higher than the maximum exposure dose EX0 for an exposure margin is usually provided. In an intermediate range between the minimum exposure dose EXc and the maximum exposure dose EX0, the resist film is reduced, but the resist film is not completely removed and remains on a surface of a substrate to some extent. Here, if the exposure dose is set considerably higher than the maximum exposure dose EX0 to cause a so-called overexposure, the resist film is excessively removed to reduce a resist pattern width which is supposed to remain. Therefore, the exposure dose EX is set to an amount higher than the maximum exposure dose EX0 by several tens of percent.

Figure 8A:
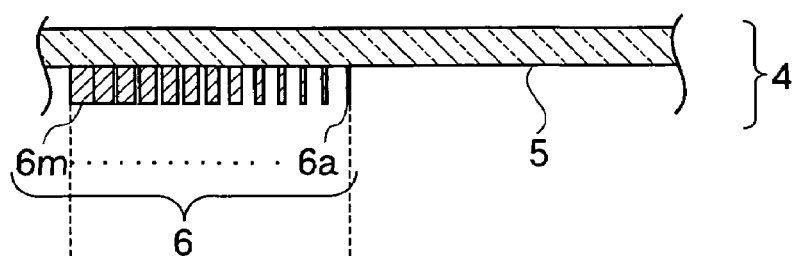
FIGS. 8A to 8C are a cross-sectional view of the reticle, a view showing transmission property of exposure light, and a cross-sectional view of a resist pattern to be formed, which are examples for describing the monitoring method according to the embodiment of the present invention.
Figure 8B:
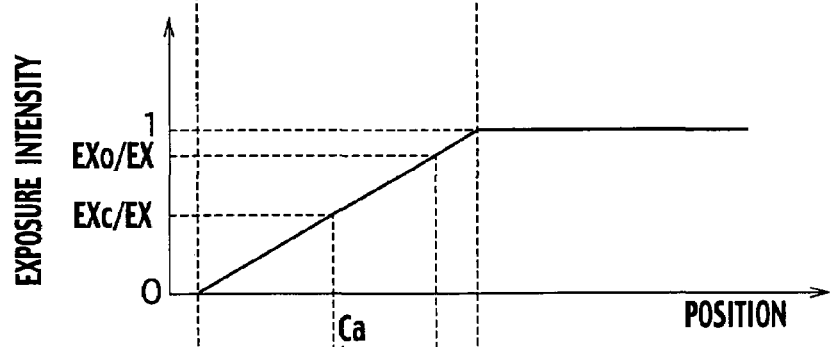
Figure 8C:
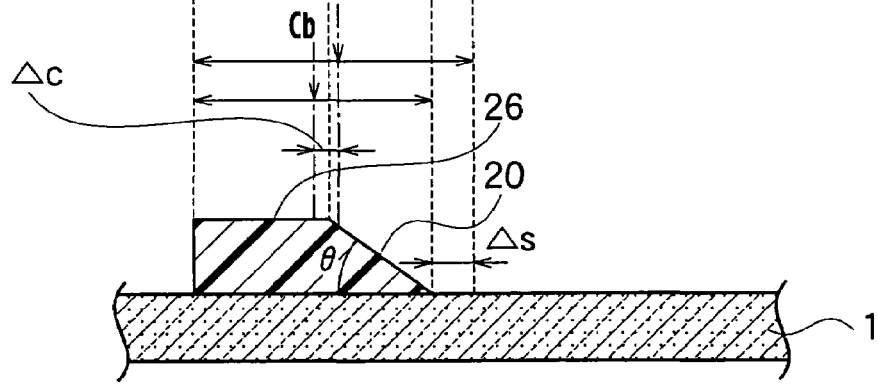

As shown in FIG. 8A, the exposure light B is irradiated on the reticle 4 including the first exposure monitor pattern 6 and the semiconductor substrate 1 coated with the resist film is thereby exposed. For example, assuming that a left-side edge of the opaque film 6m of the first exposure monitor pattern 6 to be a basic point, then as shown in FIG. 8B, an optical image thus obtained will have a distribution in which exposure intensity is gently increased toward the right side as observed from the drawing so as to reach a value "1" at a right-side edge of the opaque film 6a of the first exposure monitor pattern 6. Here, the exposure intensity is a value standardized by the exposure dose EX of the exposure light. Since the exposure dose EX is sufficiently higher than the exposure dose EX0, the exposure light is exposed onto the resist film on the semiconductor substrate 1 in accordance with a resist sensitivity curve, and a first monitor resist pattern 26 is obtained as shown in FIG. 8C. That is, the resist film remains intact in an exposure position corresponding to a range where the exposure intensity is smaller than EXc/EX. An inclined sidewall 20 of the first monitor resist pattern 26 is formed in an exposure position where the exposure intensity is in the range from EXc/EX to EX0/EX. Here, the resist film is removed in an exposure position corresponding to the exposure intensity in the range from EX0/EX to 1. Accordingly, as shown in FIG. 8C, the first monitor resist pattern 26 is reduced and receded from the edge on the opaque film 6a side of the first exposure monitor pattern 6 by a shift width $\Delta s$. On the other hand, a pattern displacement $\Delta c$ ($\approx \Delta s/2$) is created between a pattern center Ca of the exposed first exposure monitor pattern 6 and a pattern center Cb of the first monitor resist pattern 26. As a consequence, it is possible to monitor the exposure dose by measuring the pattern displacement $\Delta c$ or the shift width $\Delta s$ with an optical overlay inspection system.

Figure 9:
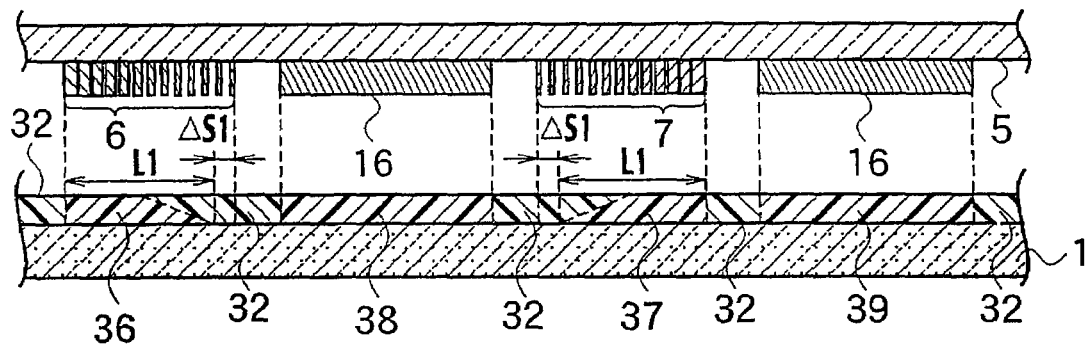
FIGS. 9 to 11 are cross-sectional views of exposure processes for describing the monitoring method according to the embodiment of the present invention.

A description will be provided for the case of performing the double exposure process by use of the reticle 4 according to the embodiment of the present invention. In the first exposure step, as shown in FIG. 9, the first displacement monitor 51 of the first mask portion 14a is exposed once on the resist film in a first exposure dose D1, for example. As a result, first and second monitor latent images 36 and 37 corresponding to the first and second exposure monitor patterns 6 and 7, and third and fourth monitor opaque portions 38 and 39 corresponding to the part of the first opaque portion 16, all of which are unexposed portions, are formed in an exposed resist film 32 representing the resist film on the semiconductor substrate 1 after exposure. As described with reference to FIG. 8C, a pattern width of each of the first and second monitor latent images 36 and 37 is reduced by a first shift width $\Delta s1$ in response to the first exposure dose D1 and is thereby defined as a first monitor width L1.

Figure 10:
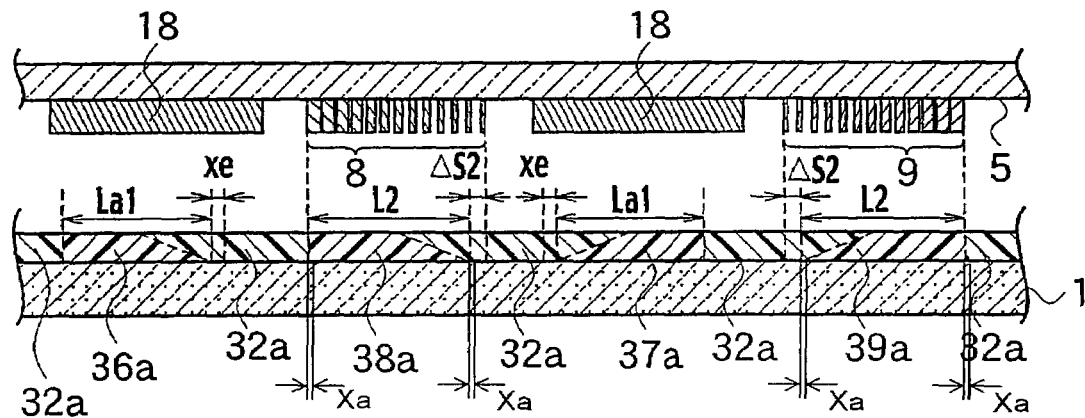

Subsequently, in the second exposure step, the second displacement monitor 52 of the second mask portion 14b is exposed in a second exposure dose D2 as shown in FIG. 10. As a result, in addition to the first and second monitor latent images 36a and 37a which are the unexposed portions, a third monitor latent image 38a is formed at the third monitor opaque portion 38 and a fourth monitor latent image 39a is formed at the fourth monitor opaque portion 39 in the exposed resist film 32a exposed in the first and second exposure steps. A pattern width of each of the third and fourth monitor latent images 38 and 39 is reduced by a second shift width $\Delta s2$ in response to the second exposure dose D2 and is thereby defined as a second monitor width L2. The first and second monitor latent images 36 and 37 exposed in the first exposure step are shielded by the second opaque portion 18 in the second exposure step. Each of the first and second monitor latent images 36a and 37a, obtained after the double exposure, is made narrower by a displacement Xe than the pattern width obtained by a single exposure in the first exposure dose D1, and a first reduced width La1 is there by defined. This is a result of overexposure caused by a fogging affect under the second opaque portion 18. The fogging affect occurs due to stray light resulting from diffraction or diffused reflection in the second exposure step.

Figure 11:
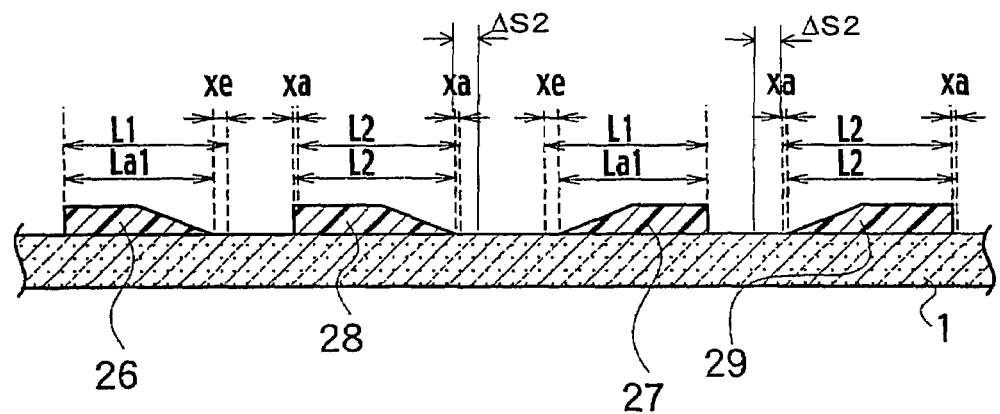

To evaluate the amount of fogging in the double exposure process, in the first exposure step shown in FIG. 9, the first displacement monitors 51 are first exposed to a predetermined number of the shot areas on the semiconductor substrate 1 while setting the first exposure dose D1 to a constant value. In the subsequent second exposure step shown in FIG. 10, the second displacement monitor 52 is exposed to the shot areas on the semiconductor substrate 1 where the first displacement monitor 51 has been exposed while changing the second exposure dose D2 as a variable exposure dose Dx. After development, the first to fourth monitor resist patterns 26 to 29, where the first to fourth exposure monitor patterns 6 to 9 of the first and second displacement monitors 51 and 52 are transferred, are formed as shown in FIG. 11. Pattern edges on the right side of the first and third monitor resist patterns 26 and 28 as observed from the front of the drawing are reduced and receded in the left direction, for example. On the contrary, pattern edges on the left side of the second and fourth monitor resist patterns 27 and 29 as observed from the front of the drawing are reduced and receded in the right direction. Moreover, the first and second monitor resist patterns 26 and 27 are shifted by the displacement Xe in opposite directions to each other because of the fogging in the variable exposure dose Dx in the second exposure step. Misalignment occurs when the third and fourth exposure monitor patterns 8 and 9 are exposed in the second exposure step. Accordingly, the third and fourth monitor resist patterns 28 and 29 are shifted in the same direction by the shift width Xa due to the double exposure. Here, the left direction, as observed from the drawing, to which the first monitor resist pattern 26 is reduced and receded will be defined as a positive direction, for example. Accordingly, first pattern displacement S1 observed in the first monitor resist pattern 26 and the third monitor resist pattern 28 obtained in the double exposure process will be expressed by:

$$S1 = Xe + Xa + \Delta s1 + \Delta s2 \quad (2).$$

Similarly, second pattern displacement S2 observed in the second monitor resist pattern 27 and the fourth monitor resist pattern 29 will be expressed by:

$$S2 = -Xe + Xa - \Delta s1 - \Delta s2 \quad (3).$$

Therefore, it is possible to derive the displacement Xe from a difference between Formula (2) and Formula (3) as:

$$(S1-S2)/2 = Xe + \Delta s1 + \Delta s2 \quad (4).$$

Figure 12:
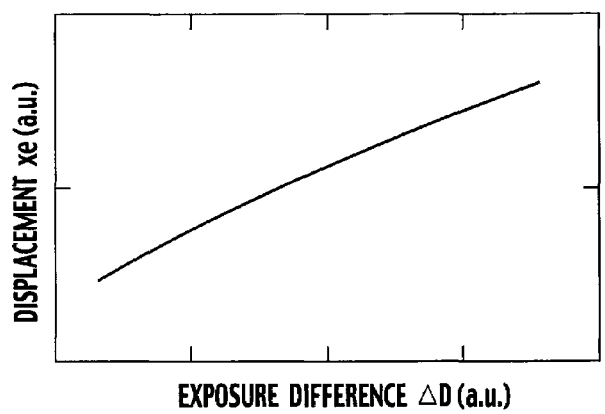
FIG. 12 is a graph showing a relation between an exposure difference and displacement in the monitoring method according to the embodiment of the present invention.

The first and second displacement S1 and S2 can be measured with an optical overlay inspection system. Here, given that an absolute value of the difference between the first exposure dose D1 and the second exposure dose (the variable exposure dose) D2 is defined as an exposure difference ΔD and the displacement Xe is plotted relative to the respective exposure differences ΔD, then a relation is obtained as shown in FIG. 12. The relation between the exposure difference ΔD and the displacement Xe can be substantially approximate to the following quadratic expression applying correction coefficients A, B and C, namely:

$$Xe = A*\Delta D^2 + B*\Delta D + C \quad (5)$$

Here, the correction coefficients A, B, and C are found by fitting the relation between the exposure difference ΔD and the displacement Xe, based on measurement data.

Next, the exposure doses in the first and second exposure steps are conformed to an exposure dose D3, and then the double exposure is similarly performed. Thereafter, displacement Xe (D3) is calculated by Formula (4) using a measurement result from the overlay inspection system. The obtained displacement Xe (D3) is substituted in Formula (5), and the exposure difference ΔD thus obtained is defined as a "fogging exposure dose E3". In this case, the same exposure dose is applied to the first and the second exposure steps in the double exposure process. Accordingly, the calculated displacement is due to the fogging affect in the exposure dose D3. Therefore, the fogging exposure dose E3 is equal to the fogging affect in the exposure dose D3 in the second exposure step of the double exposure process. In this way, according to the exposure monitoring method of the embodiment of the present invention, it is possible to quantitatively evaluate the fogging exposure dose E3 in the double exposure process.

Figure 13:
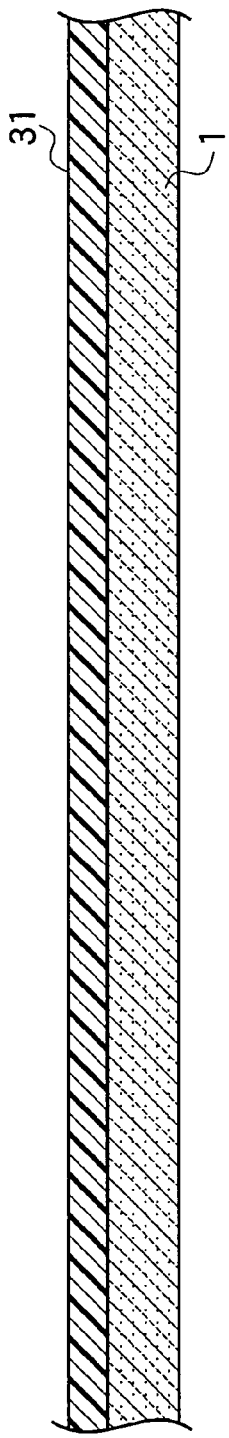
FIGS. 13 to 16 are cross-sectional views of processes which are examples for describing the monitoring method according to the embodiment of the present invention.
Figure 14:
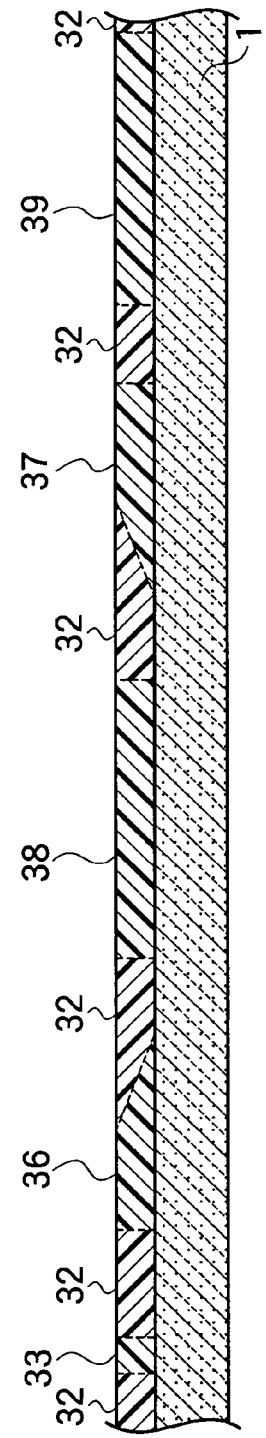
Figure 15:
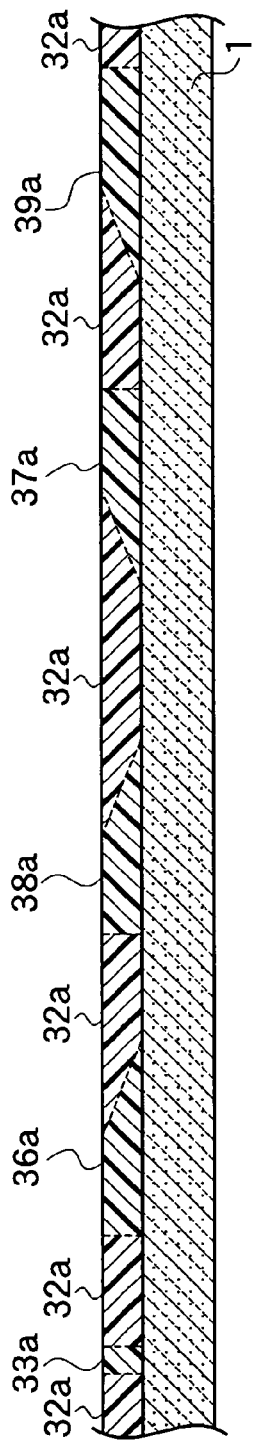
Figure 16:
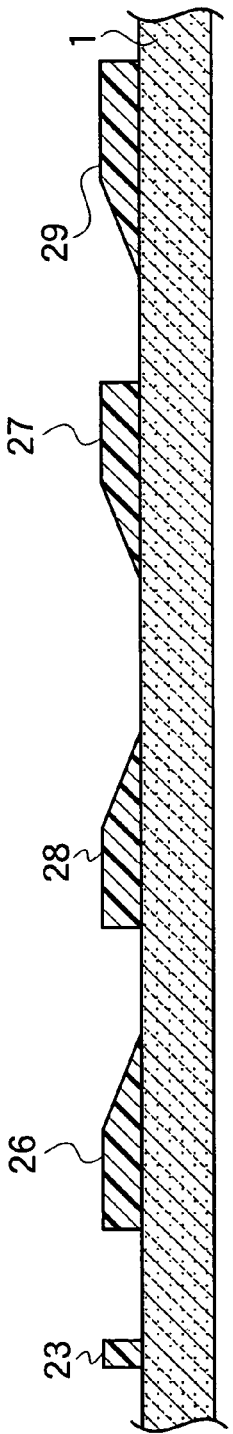

Next, an exposure method for forming a circuit pattern by use of the reticle 4 according to the embodiment of the present invention will be described with reference to FIGS. 13 to 16. A first optimum exposure dose Dm1 and a second optimum exposure dose Dm2 are predetermined for separately exposing the first and second mask portions 14a and 14b of the reticle 4. Moreover, a first fogging exposure dose E1 and a second fogging exposure dose E2 relative to the first and second optimum exposure doses Dm1 and Dm2 are respectively calculated by the exposure monitoring method according to the embodiment of the present invention.

a) First, as shown in FIG. 13, the semiconductor substrate 1 coated with a working resist film, or a positive-type resist film 31 is placed on the stage 48 of the aligner 50 provided with the reticle 4.

b) In the first exposure step, the first image of the first mask portion 14a is transferred to each shot area on the semiconductor substrate 1 by the step-and-repeat process with a first exposure dose D1. Here, the first exposure dose D1 is set to a first corrected exposure dose (Dm1−E2), which is obtained by subtracting the second fogging exposure dose E2 from the first optimum exposure dose Dm1. For example, as shown in FIG. 14, a wiring latent image 33, a first monitor latent image 36, a second monitor latent image 37, a third monitor opaque portion 38 and a fourth monitor opaque portion 39, which are all unexposed portions, are formed in an exposed resist film 32, which is changed from the unexposed resist film 31 by a chemical process promoted by exposure of light.

c) In the subsequent second exposure step, the second image of the second mask portion 14b is transferred to each shot area on the semiconductor substrate 1 where the first image of the first mask portion 14a is transferred by the step-and-repeat process with a second exposure dose D2. The second exposure dose D2 is set to the second optimum exposure dose Dm2. As shown in FIG. 15, in addition to an unexposed wiring latent image 33a and first and second monitor latent images 36a and 37a, a third monitor latent image 38a is newly formed at the third monitor opaque portion 38 and a fourth monitor latent image 39a is newly formed at the fourth monitor opaque portion 39 in an exposed resist film 32a exposed in the first and second exposure steps. Here, the wiring latent image 33a, and the first and second monitor latent images 36a and 37a are subjected to fogging in the second exposure step in the fogging exposure dose E2.

d) The semiconductor substrate 1 after the double exposure as described above is developed, and a wiring resist pattern 23 and first to fourth monitor resist patterns 26 to 29 are formed as shown in FIG. 16. The wiring resist pattern 23 is transferred in the first exposure step in the first corrected exposure dose (Dm1−E2), which is corrected in accordance with the fogging exposure dose E2 caused by the second exposure dose D2 used in the second exposure step. Accordingly, the wiring resist pattern 23 is formed in the desired pattern dimensions.

According to the exposure method of the embodiment of the present invention, it is possible to form highly accurate, well-controlled patterns in the double exposure process.

The above description has been made regarding the case where the circuit patterns such as the wiring pattern 3 are exposed on the resist film 31 in the first exposure step. However, there is also a case where the circuit patterns such as the wiring pattern are exposed in the second exposure step on the region which is shielded during the first exposure step. In such a case, a similar effect is obtained as a matter of course if a second corrected exposure dose (Dm2−E1), which is obtained by subtracting the first fogging exposure dose E1 from the second optimum exposure dose Dm2, is used as the second exposure dose D2 in the second exposure step. Moreover, when expositing different circuit patterns respectively in the first and second exposure steps, a similar effect has been confirmed by use of the first and second corrected exposure doses (Dm1−E2) and (Dm2−E1) as the first and second exposure doses D1 and D2, respectively.

MODIFIED EXAMPLE

Next, a reticle for double exposure according to a modified example of the embodiment of the present invention will be described. This modified example of the embodiment of the present invention is characterized by an exposure monitor pattern. Since other factors are similar to the embodiment of the present invention, duplicate description will be omitted herein.

Figure 17:
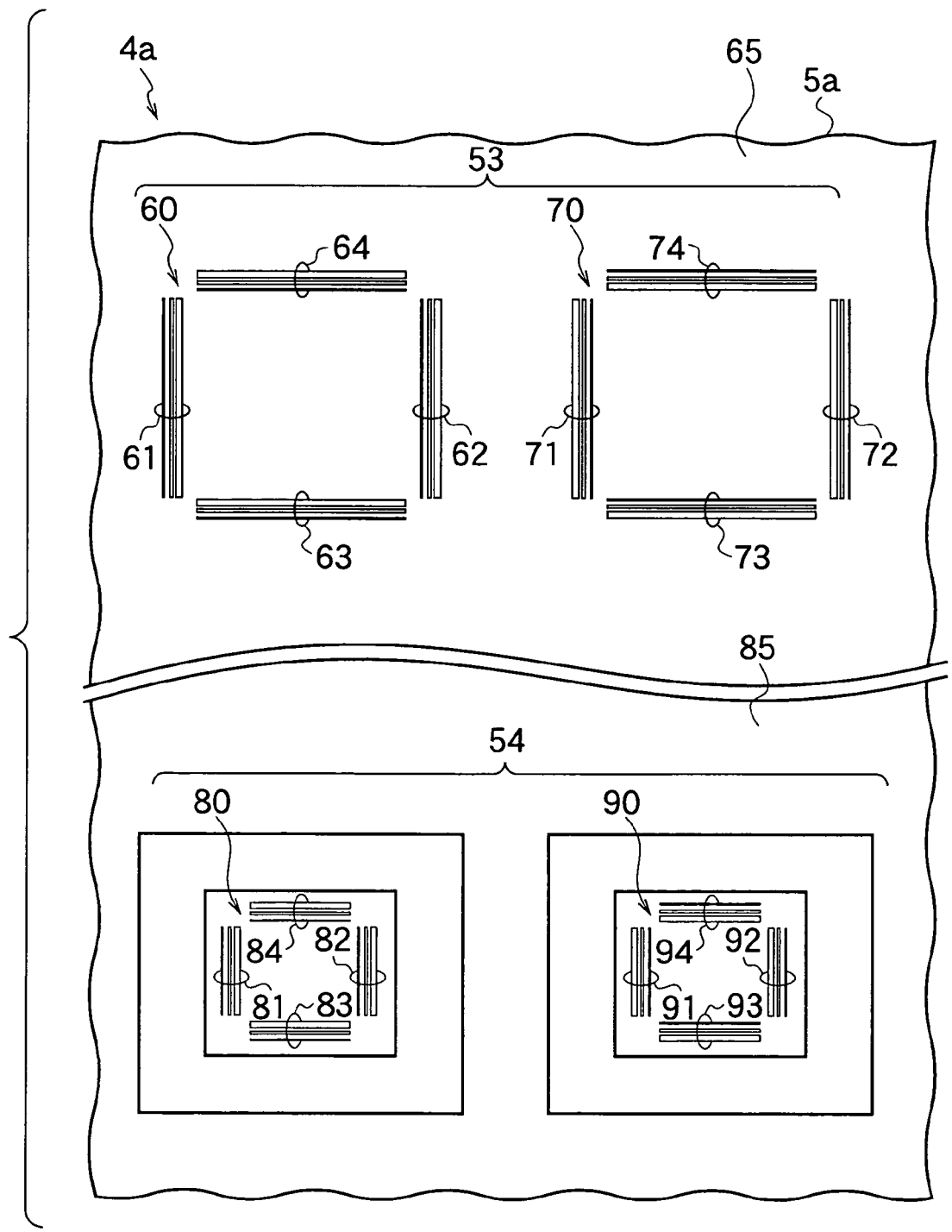
FIG. 17 is a plan view showing one example of a reticle according to a modified example of the embodiment of the present invention.

In the embodiment of the present invention, the first to fourth exposure monitor patterns 6 to 8 to be provided in the first and second displacement monitors 51 and 52 have a single pattern in common. It is possible to enhance accuracy in displacement measurement by measuring a pattern displacement of a plurality of exposure monitor groups instead of a single exposure monitor, for example. As a modified example of the embodiment of the present invention, FIG. 17 shows a reticle 4a including box-shaped exposure monitors. As shown in FIG. 17, the reticle 4a includes a first displacement monitor 53 and a second displacement monitor 54 on a transparent substrate 5a. Similar to the reticle 4 described above, the first displacement monitor 53 is provided at a first exposure mask portion to be used in the first exposure step, and the second displacement monitor 54 is provided at a second exposure mask portion to be used in the second exposure step.

The first displacement monitor 53 includes a first exposure monitor box 60 provided with first to fourth monitors 61 to 64 which are arranged in a frame shape, a second exposure monitor box 70 provided with first to fourth monitors 71 to 74 which are also arranged in a frame shape, and a first opaque portion 65 which is made of a uniform opaque film.

The second displacement monitor 54 includes a third exposure monitor box 80 provided with first to fourth monitors 81 to 84 which are arranged in a frame shape, a fourth exposure monitor box 90 provided with first to fourth monitors 91 to 94 which are also arranged in a frame shape, and a second opaque portion 85 which is made of a uniform opaque film.

Here, although details are omitted in FIG. 17, each of the first to fourth monitors 61 to 64, 71 to 74, 81 to 84, and 91 to 94 in the modified example of the embodiment of the present invention is an exposure monitor which includes the diffraction grating pattern having the same structure as the first exposure monitor pattern 6 shown in FIG. 7. In the first and third exposure monitor boxes 60 and 80, each of the first and second monitors 61, 62, 81, and 82 is a diffraction grating in which the opening ratio thereof is increased in a direction from the right to left of FIG. 17, for example. Each of the third and fourth monitors 63, 64, 83, and 84 is a diffraction grating in which the opening ratio thereof is increased in a direction from top to bottom of the drawing. On the other hand, in the second and fourth exposure monitor boxes 70 and 90, each of the first and second monitors 71, 72, 91, and 92 is a diffraction grating in which the opening ratio thereof is increased in a direction from the left to right of FIG. 17, for example. Each of the third and fourth monitors 73, 74, 93, and 94 is a diffraction grating in which the opening ratio thereof is increased in a direction from bottom to top of the drawing.

Moreover, the first and second exposure monitor boxes 60 and 70 provided at the first displacement monitor 53 are overlaid so as to be fitted within a region shielded by the second opaque portion 85 of the second displacement monitor 54. The third and fourth exposure monitor boxes 80 and 90 provided at the second displacement monitor 54 are overlaid so as to be fitted within a region shielded by the first opaque portion 65 of the first displacement monitor 53.

In FIG. 17, the first and third exposure monitor boxes 60 and 80 create pattern shifts toward an upper right direction as observed with respect to the drawing as a result of exposure. The second and fourth exposure monitor boxes 70 and 90 create pattern shifts toward a lower left direction as observed with respect to the drawing. In this way, according to the reticle 4a, it is possible to utilize not only one-dimensional displacement but also two-dimensional displacement to be represented as the pattern displacement of the first and second displacement monitors 53 and 54. Accordingly, it is possible to measure the fogging exposure dose of the double exposure with higher accuracy.

As described above, according to the modified example of the embodiment of the present invention, it is possible to measure the influence of the fogging affect in the double exposure process easily with high accuracy and with high reproducibility.

OTHER EMBODIMENTS

Figure 18A:
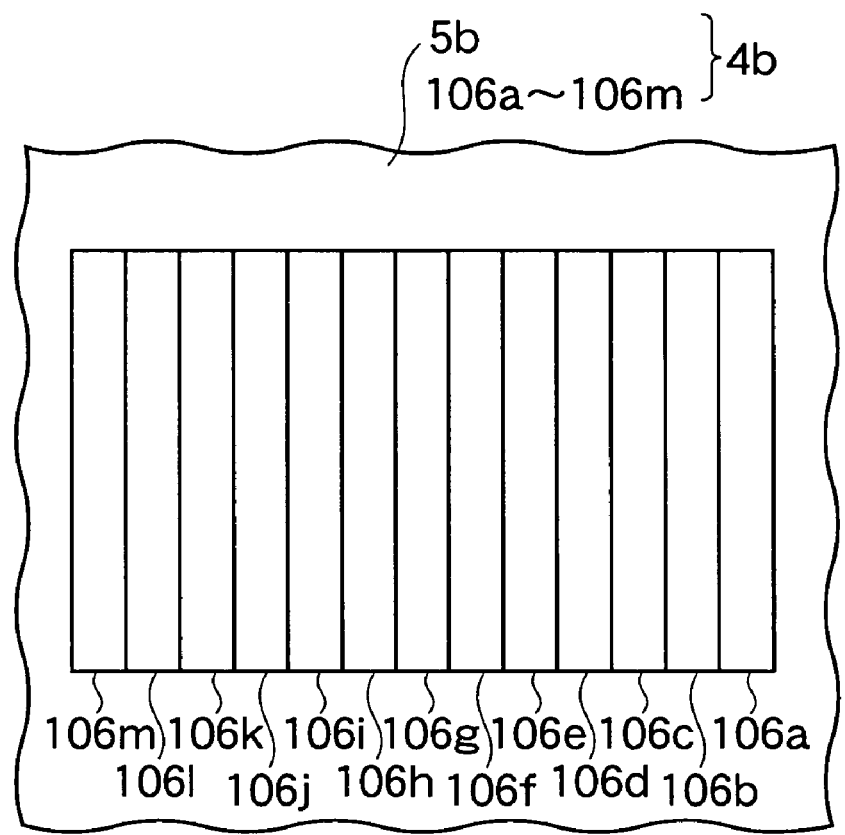
FIGS. 18A and 18B are a plan view and a cross-sectional view showing one example of a reticle according to another embodiment of the present invention.
Figure 18B:
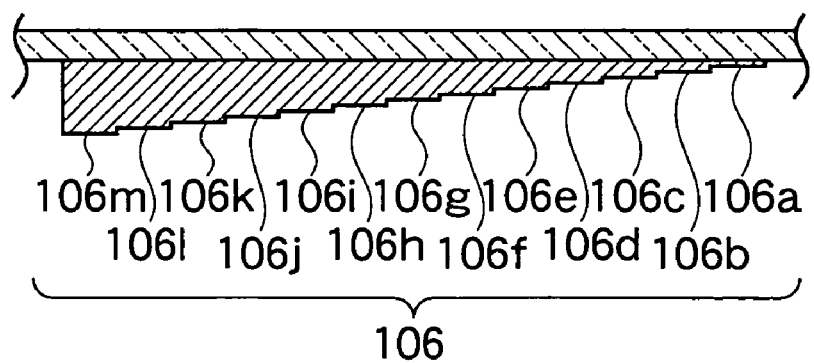

To provide a distribution of transmittance of the exposure light, the embodiment of the present invention has applied an exposure pattern in which the opening ratio of the diffraction grating is changed at a desired rate. However, it is needless to say that any other method is applicable, instead of the diffraction grating, as long as such a method can provide for the distribution of transmittance of the exposure light. For example, as shown in FIGS. 18A and 18B, a plurality of opaque films 106a to 106m are provided on a transparent substrate 5b at constant widths while varying thicknesses at a constant rate as a first exposure monitor pattern 106 used in a reticle 4b. Even metal can provide an optical transmittance when the metal is formed with a thin film. Accordingly, when the metal used as the opaque films 106a to 106m is deposited while providing a thickness distribution thereto, the metal can change the optical transmittances. The thicknesses of the respective opaque films are increased stepwise from the opaque film 106a to the opaque film 106m. Therefore, the right side of the opaque film 106a as observed from the front of the drawing shows the maximum transmittance value which is close to 100% and the opaque film 106m shows a transmittance of 0%. It is by all means possible to apply a structure by varying the thicknesses of the opaque films stepwise to the exposure monitor described in the embodiment and the modified example of the present invention. Alternatively, it is possible to form the exposure monitor by use of a structure in which the thicknesses of the opaque films are changed continuously in one direction. Moreover, it is needless to say that a similar effect is achieved by a structure in which an opaque material is formed into particles and particle density is changed therein so as to vary the optical transmittance.

The embodiment of the present invention has been described by using an example of performing a double exposure with one reticle. Even in the case of performing a multiple exposure process using a plurality of reticles, it is by all means possible to evaluate the fogging exposure created in a plurality of exposure processes in a similar manner. Moreover, the embodiment of the present invention has applied a KrF excimer laser reduction projection aligner for convenience of explanation. However, it is needless to say that ultraviolet rays such as the i-line or the g-line, other excimer lasers, electron beams, X-rays and the like are also applicable as the light source. Moreover, an aligner of a contact type, a proximity type, a mirror projection type or the like may be used.

Various modifications will become possible for those skilled in the art after receiving the teachings of the present disclosure without departing from the scope thereof.

What is claimed is:

1. A reticle, comprising:
   a first mask portion including a first opaque portion, a first exposure monitor pattern provided within a first window portion in the first opaque portion and configured to increase optical transmittances in a first direction, and a second exposure monitor pattern provided within a second window portion in the first opaque portion and configured to increase optical transmittances in a direction reverse to the first direction; and
   a second mask portion including a second opaque portion, a third exposure monitor pattern provided within a third window portion in the second opaque portion in a position corresponding to the first opaque portion upon alignment with a transferred image by the first mask portion and configured to increase optical transmittances in the first direction, and a fourth exposure monitor pattern provided within a fourth window portion in the second opaque portion in a position corresponding to the first opaque portion and configured to increase optical transmittances in the reverse direction.

2. The reticle of claim 1, wherein the first to fourth exposure monitor patterns are respectively formed as diffraction gratings.

3. The reticle of claim 2, wherein a pitch of the diffraction grating is smaller than a width determined by a wavelength of a light source for the exposure using the reticle, a numerical aperture of a lens, and a coherence factor of an optical system.

4. The reticle of claim 3, wherein the width is a value obtained by dividing the wavelength by a sum of the coherence factor and 1, and by the numerical aperture.

5. The reticle of claim 1, wherein the first mask portion and the second mask portion are provided on an identical mask substrate.

6. The reticle of claim 1, wherein the first mask portion is provided on a first mask substrate, and the second mask portion is provided on a second mask substrate.

7. An exposure monitoring method, comprising:
   transferring a first exposure monitor pattern onto a resist film through a first window portion provided on a first opaque portion by a first exposure dose while allowing the exposure dose to form an inclined distribution in a first direction;
   transferring a second exposure monitor pattern onto an unexposed portion of the resist film through a second window portion provided on the first opaque portion by the first exposure dose while allowing the exposure dose to form an inclined distribution in a direction reverse to the first direction;
   transferring a third exposure monitor pattern onto an unexposed portion of the resist film through a third window portion provided on a second opaque portion located in a position corresponding to the first opaque portion by a variable exposure dose while allowing the exposure dose to form an inclined distribution in the first direction;
   transferring a fourth exposure monitor pattern onto an unexposed portion of the resist film through a fourth window portion provided on the second opaque portion located in a position corresponding to the first opaque portion by the variable exposure dose while allowing the exposure dose to form an inclined distribution in the reverse direction;
   measuring a first pattern displacement, the first pattern displacement being a sum of a displacement of the first monitor resist pattern and a displacement of the third monitor resist pattern, and a second pattern displacement, the second pattern displacement being a sum of a displacement of the second monitor resist pattern and a displacement of the fourth monitor resist pattern;
   obtaining a displacement between the first pattern displacement and the second pattern displacement relative to an exposure difference between the first exposure dose and the variable exposure dose; and
   calculating a fogging exposure dose attributable to the first exposure dose from a displacement value provided when the variable exposure dose is equal to the first exposure dose.

8. The exposure monitoring method of claim 7, wherein the displacement is expressed by a quadratic expression of the exposure difference.

9. The exposure monitoring method of claim 7, wherein the first to fourth exposure monitor patterns are respectively formed as diffraction gratings.

10. The exposure monitoring method of claim 9, wherein a pitch of the diffraction grating is smaller than a width which is determined by a wavelength of a light source used in the exposure, a numerical aperture of a lens, and a coherence factor of an optical system.

11. The exposure monitoring method of claim 9, wherein the width is a value obtained by dividing the wavelength by a sum of the coherence factor and 1, and by the numerical aperture.

12. An exposure method, comprising:
    respectively measuring first and second fogging exposure doses relative to a first exposure dose for exposing a first mask portion so as to transfer a first image on an inspection resist film and a second exposure dose for exposing a second mask portion while overlaying a second image transferred through the second mask portion over the first image;
    preparing a reticle including the first mask portion, and a substrate coated with a working resist film;
    transferring the first image of the first mask portion onto the working resist film by an exposure dose obtained by subtracting the second fogging exposure dose from the first exposure dose;
    preparing a reticle including the second mask portion; and
    transferring the second image of the second mask portion onto the working resist film by an exposure dose obtained by subtracting the first fogging exposure dose from the second exposure dose.

13. The exposure method of claim 12, wherein the measurement of the first fogging exposure dose comprises:
    transferring a first exposure monitor pattern onto the inspection resist film through a first window portion provided on a first opaque portion of the first mask portion by the first exposure dose while allowing the exposure dose to form an inclined distribution in a first direction;

transferring a second exposure monitor pattern onto an unexposed portion of the inspection resist film through a second window portion provided on the first opaque portion by the first exposure dose while allowing the exposure dose to form an inclined distribution in a direction reverse to the first direction;

transferring a third exposure monitor pattern onto an unexposed portion of the inspection resist film through a third window portion provided on a second opaque portion of the second mask portion located in a position corresponding to the first opaque portion by a variable exposure dose while allowing the exposure dose to form an inclined distribution in the first direction;

transferring a fourth exposure monitor pattern onto an unexposed portion of the inspection resist film through a fourth window portion provided on the second opaque portion located in a position corresponding to the first opaque portion by the variable exposure dose while allowing the exposure dose to form an inclined distribution in the reverse direction;

measuring a first pattern displacement, the first pattern displacement being a sum of a displacement of the first monitor resist pattern and a displacement of the third monitor resist pattern, and a second pattern displacement, the second pattern displacement being a sum of a displacement of the fourth monitor resist pattern;

obtaining a displacement between the first pattern displacement and the second pattern displacement relative to an exposure difference between the first exposure dose and the variable exposure dose; and calculating the fogging exposure dose attributable to the first exposure dose from a displacement value provided when the variable exposure dose is equal to the first exposure dose.

14. The exposure method of claim 12, wherein the measurement of the second fogging exposure dose comprises transferring the first image of the first mask portion by the second exposure dose onto another inspection resist film, transferring the second image of the second mask portion by the second exposure dose, obtaining another displacement, and calculating the second fogging exposure dose attributable to the second exposure dose.

15. The exposure method of claim 13, wherein the displacement is expressed by a quadratic expression of the exposure difference.

16. The exposure method of claim 13, wherein the first to fourth exposure monitor patterns are respectively formed as diffraction gratings.

17. The exposure method of claim 16, wherein a pitch of the diffraction grating is smaller than a width determined by a wavelength of a light source used in the exposure, a numerical aperture of a lens, and a coherence factor of an optical system.

18. The exposure method of claim 16, wherein the width is a value obtained by dividing the wavelength by a sum of the coherence factor and 1, and by the numerical aperture.

19. A manufacturing method of a semiconductor device, comprising:

respectively measuring first and second fogging exposure doses relative to a first exposure dose for exposing a first mask portion so as to transfer a first image on an inspection resist film and a second exposure dose for exposing a second mask portion while overlaying a second image transferred through the second mask portion over the first image;

coating a working resist film on a semiconductor substrate;

placing the semiconductor substrate and a reticle including the first mask portion on an aligner;

transferring the first image of the first mask portion onto the working resist film by an exposure dose obtained by subtracting the second fogging exposure dose from the first exposure dose;

placing a reticle including the second mask portion on the aligner; and transferring the second image of the second mask portion onto the working resist film by an exposure dose obtained by subtracting the first fogging exposure dose from the second exposure dose.

20. The manufacturing method of claim 19, wherein the measurement of the first fogging exposure dose comprises:

transferring a first exposure monitor pattern onto the inspection resist film through a first window portion provided on a first opaque portion of the first mask portion by the first exposure dose while allowing the exposure dose to form an inclined distribution in a first direction;

transferring a second exposure monitor pattern onto an unexposed portion of the inspection resist film through a second window portion provided on the first opaque portion by the first exposure dose while allowing the exposure dose to form an inclined distribution in a direction reverse to the first direction;

transferring a third exposure monitor pattern onto an unexposed portion of the inspection resist film through a third window portion provided on a second opaque portion of the second mask portion located in a position corresponding to the first opaque portion by a variable exposure dose while allowing the exposure dose to form an inclined distribution in the first direction;

transferring a fourth exposure monitor pattern onto an unexposed portion of the inspection resist film through a fourth window portion provided on the second opaque portion located in a position corresponding to the first opaque portion by the variable exposure dose while allowing the exposure dose to form an inclined distribution in the reverse direction;

measuring a first pattern displacement, the first pattern displacement being a sum of a displacement of the first monitor resist pattern and a displacement of the third monitor resist pattern, and a second pattern displacement, the second pattern displacement being a sum of a displacement of the second monitor resist pattern and a displacement of the fourth monitor resist pattern;

obtaining a displacement between the first pattern displacement and the second pattern displacement relative to an exposure difference between the first exposure dose and the variable exposure dose; and calculating the fogging exposure dose attributable to the first exposure dose from a displacement value provided when the variable exposure dose is equal to the first exposure dose.

21. The manufacturing method of claim 19, wherein the measurement of the second fogging exposure dose comprises transferring the first image of the first mask portion by the second exposure dose onto another inspection resist film, transferring the second image of the second mask portion by the second exposure dose, obtaining another displacement, and calculating the second fogging exposure dose attributable to the second exposure dose.

22. The manufacturing method of claim 20, wherein the displacement is expressed by a quadratic expression of the exposure difference.

23. The manufacturing method of claim 20, wherein the first to fourth exposure monitor patterns are respectively formed as diffraction gratings.

24. The manufacturing method of claim 23, wherein a pitch of the diffraction grating is smaller than a width determined by a wavelength of a light source used in the exposure, a numerical aperture of a lens, and a coherence factor of an optical system.

25. The manufacturing method of claim 23, wherein the width is a value obtained by dividing the wavelength by a sum of the coherence factor and 1, and by the numerical aperture.

* * * * *

UNITED STATES PATENT AND TRADEMARK OFFICE
CERTIFICATE OF CORRECTION

PATENT NO. : 7,092,068 B2
APPLICATION NO. : 10/721903
DATED : August 15, 2006
INVENTOR(S) : Komine It is certified that error appears in the above-identified patent and that said Letters Patent is hereby corrected as shown below:

Claim 13, column 15, line 31, after "sum of" insert --a displacement of the second monitor resist pattern and--.

Signed and Sealed this

Fifth Day of December, 2006

JON W. DUDAS
*Director of the United States Patent and Trademark Office*